United States Patent [19]

Ogita

[11] 4,272,788
[45] Jun. 9, 1981

[54] RECEIVER FOR TELEVISION SOUND MULTIPLEX BROADCASTING AND FM STEREO MULTIPLEX BROADCASTING

[75] Inventor: Minoru Ogita, Hamamatsu, Japan

[73] Assignee: Nippon Gakki Seizo Kabushiki Kaisha, Hamamatsu, Japan

[21] Appl. No.: 84,366

[22] Filed: Oct. 12, 1979

[30] Foreign Application Priority Data

Oct. 19, 1978 [JP] Japan .................. 53-128904

[51] Int. Cl.³ .................................................. H04N 5/46
[52] U.S. Cl. ............................ 358/189; 179/1 GM; 179/1 GC; 358/198
[58] Field of Search .................. 179/1 GM, 1 GC; 358/198, 197, 144, 189

[56] References Cited

U.S. PATENT DOCUMENTS

| | | | |
|---|---|---|---|
| 2,865,987 | 12/1958 | Migard | 358/189 |
| 3,054,058 | 9/1962 | Powler | 358/189 |
| 3,135,922 | 6/1964 | Elamd | 358/189 |
| 3,686,431 | 8/1972 | Kitaoka et al. | 179/1 GC |
| 4,139,866 | 2/1979 | Wegner | 358/198 |

Primary Examiner—Richard Murray
Attorney, Agent, or Firm—Frishauf, Holtz, Goodman & Woodward

[57] ABSTRACT

A receiver for selectively receiving either an FM-FM type television sound multiplex broadcasting or an FM-AM type FM stereo multiplex broadcasting includes a PLL (phase-locked loop) circuit for forming a 38 kHz switching carrier for demodulating an FM stereo multiplex signal during reception of the FM stereo multiplex broadcasting, which PLL circuit is concurrently used to attain various purposes in receiving the television sound multiplex broadcasting. In a first embodiment, the PLL circuit is used for FM-demodulating a subchannel signal during reception of the television sound multiplex broadcasting. In a second embodiment, the PLL circuit is used to detect a state that the television sound multiplex broadcasting wave is received during reception of the television sound broadcasting. In a third embodiment, the PLL circuit is used to detect whether the television sound multiplex broadcasting being received is a stereo broadcasting or a dual sound broadcasting.

8 Claims, 10 Drawing Figures

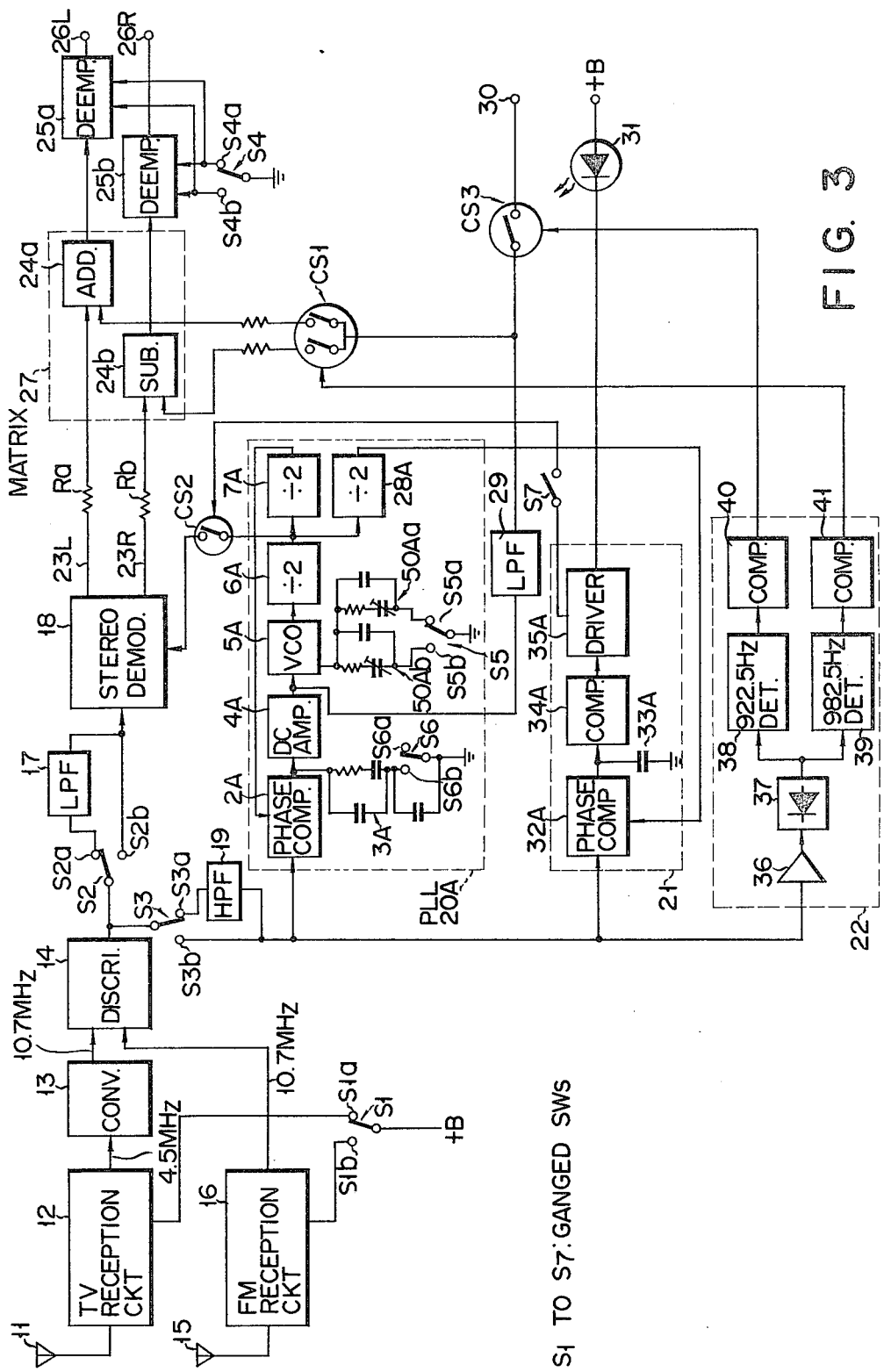

RECEIVER FOR TELEVISION SOUND MULTIPLEX BROADCASTING AND FM STEREO MULTIPLEX BROADCASTING

BACKGROUND OF THE INVENTION

The invention relates to a receiver for selectively receiving an FM-AM type FM stereo multiplex broadcasting and an FM-FM type television sound multiplex broadcasting.

With recent practical realization of a television (TV) sound multiplex broadcasting in Japan, a receiver which permits reception of both TV sound multiplex broadcasting and the conventional FM stereo multiplex broadcasting has been desired. Both types of broadcasting employ the FM system for main carrier modulation but different modulation systems for subcarrier modulation. In the TV sound multiplex broadcasting, the subcarrier is frequency-modulated while, in the FM stereo multiplex broadcasting, it is amplitude-modulated as is well known. This makes it difficult to use a common demodulator circuit for the TV sound multiplex signal and FM stereo multiplex signal. For this reason, it is a common practice that separate demodulator circuits are provided for demodulating both of the multiplex signals. In this respect, a conventional receiver needs a number of circuit components, thus increasing the cost and size of the receiver.

In this type receiver, in order to indicate whether the TV sound broadcasting is the multiplex broadcasting or not there is a need for provision of a circuit for detecting the multiplex broadcasting. In the conventional receiver, the TV sound multiplex-broadcasting detecting circuit is provided separately from the FM stereo multiplex demodulator circuit. Also in this respect, the cost and size of the receiver inevitably increase. Television sound multiplex broadcasting is categorized into a stereo broadcasting and a dual sound broadcasting, e.g. a bilingual broadcasting. The receiver needs therefore a circuit for automatically switching the receiving circuit depending on the stereo broadcasting or the dual sound broadcasting and a visual indication circuit therefor. In the conventional receiver, such circuits are provided independently of the demodulator circuit for FM stereo multiplex broadcasting. This also leads to the same problems as mentioned above.

SUMMARY OF THE INVENTION

Accordingly, an object of the invention is to provide a receiver for TV sound multiplex broadcasting and FM stereo multiplex broadcasting which has a decreased number of circuit components and thus whose cost and size are decreased.

Broadly, according to the invention, a PLL (phase-locked loop) circuit for forming a switching carrier signal of 38 kHz to demodulate an FM stereo multiplex signal during reception of an FM stereo multiplex broadcasting is concurrently used to attain various purposes in receiving a TV sound multiplex broadcasting.

In a receiver of a first embodiment according to the invention, the PLL circuit is used for demodulating an FM subchannel signal in receiving the TV sound multiplex broadcasting.

In a receiver of a second embodiment according to the invention, the PLL circuit is used for detecting a control channel signal attendant on the TV sound multiplex broadcasting when such broadcasting is being received.

In a third embodiment of the receiver according to the invention the PLL circuit is used to detect whether the TV sound multiplex broadcasting being received is stereo broadcasting or dual sound broadcasting.

BRIEF DESCRIPTION OF THE DRAWING

FIG. 3 is a block diagram of a receiver according to a first embodiment of the invention;

DESCRIPTION OF THE PREFERRED EMBODIMENTS

Figure 1:
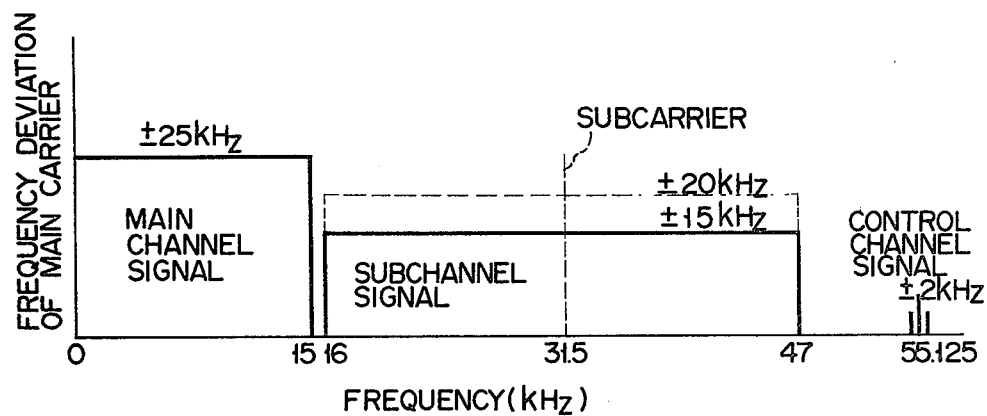
FIG. 1 shows a frequency spectrum of a composite signal used in an FM-FM type TV sound multiplex broadcasting.

Prior to the description of the invention, a TV sound multiplex system will be described in brief with reference to FIG. 1 showing a frequency spectrum of a TV sound multiplexed baseband signal or composite signal. As shown, the baseband signal includes a main channel signal, a subchannel signal and a control channel signal. The main channel signal is a main sound signal in dual sound broadcasting or the sum of right and left audio signals in stereophonic broadcasting. The main channel signal has a frequency range from 0 to 15 kHz and a maximum frequency deviation of a main carrier due to the main channel signal is ±25 kHz. The subchannel signal is formed by frequency-modulating a subcarrier signal by a subsound signal in the dual sound broadcasting, or by frequency-modulating the subcarrier by a difference between the right and left audio signals in the stereo broadcasting. The subcarrier signal has a maximum frequency deviation of ±10 kHz and a frequency two times that of a horizontal synchronizing signal, that is to say, about 31.5 kHz. The subchannel signal has a frequency range from 16 kHz to 47 kHz. The maximum frequency deviation of the main carrier signal due to the subchannel signal is ±20 kHz in the stereophonic broadcasting and is ±15 kHz in the dual sound broadcasting. The control channel signal is formed by amplitude-modulating a control subcarrier signal of about 55.125 kHz (3.5 times the horizontal synchronizing frequency) by a control signal. The control signal is a sinusoidal signal of 922.5 Hz in the dual sound broadcasting and of 982.5 Hz in the stereophonic broadcasting. The maximum frequency deviation of the main carrier signal by the control channel signal is ±2 kHz. As is well known, a baseband signal for FM stereophonic broadcasting includes a main channel signal which is the sum of right and left audio signals, a subchannel signal which is formed by suppressed-carrier amplitude-modulating a subcarrier signal of 38 kHz by the difference between the right and left audio signals, and a pilot signal of 19 kHz.

In a receiver according to this invention, a PLL (phase-locked loop) circuit is used as a major circuit component. Accordingly, the PLL circuit will be described with reference to FIG. 2 for ease of understanding of the invention. An input signal of a frequency $f_i$ inputted to an input terminal 1 is applied to a phase comparator 2 where it is phase-compared with an output signal derived from a ½ frequency divider or binary counter 7 to be described later. As a result of the phase comparison, an output voltage $V_d$ corresponding to a phase error is developed across an RC loop filter 3, which in turn is applied as a DC control voltage to a voltage-controlled oscillator (VCO) through a DC amplifier 4. The VCO 5 produces an output signal of a frequency $f_o$ deviated by a frequency corresponding to the DC control voltage from a self-running frequency $f'_o$ determined by an RC circuit 50 externally attached to the VCO 5. The output signal of VCO 5 is applied to a ½ frequency divider or binary counter 6 where it is frequency-divided by a factor of two, and then is applied to the frequency divider 7 where it is similarly frequency-divided by a factor of two. Accordingly, an output signal of the frequency divider 7 has a frequency of $f_o/4$ which in turn is applied to the phase comparator 2 as described above. The VCO 5 is so controlled that a frequency difference between the two input signals applied to the phase comparator 2 becomes small. The PLL circuit is finally locked in a state in which the output frequency $f_o/4$ of the frequency divider 7 is exactly equal to the input frequency $f_i$ with a phase difference of 90° therebetween. Accordingly, if the input signal includes a pilot signal of 19 kHz of the FM stereophonic broadcasting and further if the self-running frequency $f'_o$ of the VCO 5 is set to a frequency in the vicinity of 76 kHz, which is four times the frequency of the pilot signal, by the RC circuit 50, the output frequency of VCO 5 becomes exactly 76 kHz in synchronism with the pilot signal and the output frequency of frequency divider 6 becomes exactly 38 kHz. Thus, a switching carrier signal of 38 kHz used in switching type FM demodulation is taken out from an output terminal 8 connected to the output terminal of frequency divider 6.

If an input signal applied to the input terminal 1 includes a control channel signal centered at 55.125 kHz for the television sound multiplex broadcasting, and further if the self-running frequency $f'_o$ of VCO 5 is selected at about 220.5 kHz, which is four times as much as 55.125 kHz, then the output frequency of frequency divider 6 becomes exactly 110.25 kHz which is double the control subcarrier frequency. Moreover, if the input signal includes a control signal of 982.5 kHz or 922.5 Hz, and further the self-running frequency $f'_o$ of VCO 5 is set in the vicinity of the frequency four times the control signal frequency, the output frequency of the frequency divider 6 becomes exactly two times the control signal frequency. When the input signal applied to the input terminal 1 is an FM signal and the PLL circuit is locked, the oscillating frequency of VCO 5 follows an instantaneous frequency of the FM signal. Accordingly, a phase error output voltage $V_d$ corresponds to an FM demodulated audio signal. Accordingly, an FM-demodulated output signal is taken out from a terminal 9 connected to the output of loop filter 3 or a terminal 10 connected to the output of DC amplifier 4.

Reference is made to FIG. 3 illustrating a first embodiment of the receiver according to the invention in which a PLL circuit is used to produce a 38 kHz subcarrier signal in synchronism with a 19 kHz pilot signal during the reception of an FM multiplex stereophonic broadcasting, and to FM detect a subchannel signal during the reception of a TV sound multiplex broadcasting. A TV sound carrier signal received by a TV receiving antenna 11 is converted into a TV sound intermediate frequency signal centered at 4.5 MHz by a TV reception circuit 12 which in turn is applied to a frequency converter 13 where it is up-converted into another intermediate frequency signal centered at 10.7 MHz like an FM intermediate frequency signal. An FM radio carrier signal received by an FM broadcasting receiving antenna 15 is applied to an FM reception circuit 16 where it is converted into an FM intermediate frequency signal centered at 10.7 MHz. The reception circuits 12 and 16 are selectively operated by means of a switch S1. More specifically, when the switch S1 is changed over to a fixed contact, S1a, a power +B is applied to the TV reception circuit 12 while, when the switch S1 is changed over to the other fixed contact S1b, the power +B is applied to the FM reception circuit 16.

The outputs of the converter 13 and the FM reception circuit 16 are coupled to a frequency discriminator 14 having an S-curve response centered at 10.7 MHz. From the discriminator 14, an FM demodulated baseband or composite signal is taken out.

Switches S2 and S3 are connected to the output of discriminator 14. The switch S2 has a contact S2a connected to a switching type stereo demodulator 18 having outputs 23L and 23R through a lowpass filter 17 and a contact S2b directly connected to the stereo demodulator 18. The switch S3 has a contact S3a connected through a highpass filter 19 to a PLL circuit 20A and first and second detector circuits 21 and 22. The other contact S3b of switch S3 is directly connected to those circuits 20A, 21 and 22 as shown. The lowpass filter 17 has a cutoff frequency of about 15.5 kHz so as to permit a main channel component in the composite signal of the TV sound multiplex broadcasting to pass therethrough. The highpass filter 19 has a cutoff frequency of about 15.5 kHz so as to block the passage of the main channel signal component therethrough.

The stereo demodulator 18 is so arranged to separate a stereo composite signal coming from the discriminator 14 into right and left audio signals by a 38 kHz switching carrier signal during the reception of the FM stereophonic broadcasting. The output 23L of stereo demodulator 18 is connected through a resistor Ra to an adder circuit 24a which is connected to a left channel output terminal 26L through a deemphasis circuit 25a. Similarly, the output terminal 23R of the stereo demodulator 18 is connected through a resistor Rb to a subtractor circuit 24b which is connected to a right channel output terminal 26R through a deemphasis circuit 25b. The adder 24a and the subtractor 24b cooperate to form a matrix circuit 27 which receives an output signal representing the sum of the left and right audio signals from the demodulator 18, and a signal representing the difference between the left and right audio signals applied thereto through a control switch CS1 to be described later to obtain the separate left and right audio signals when the TV sound stereophonic broadcasting is received. The deemphasis circuits 25a and 25b are switched by a switch S4 so that the frequency response thereof is adapted for the FM radio or TV sound broadcasting. More specifically, when the switch S4 is changed over to its fixed contact S4a, the deemphasis circuits 25a and 25b each have a frequency response of 75 μs adapted for TV sound and, on the other hand, when the switch S4 is changed over to its fixed contact S4b, the frequency response is switched to 50 μs for FM sound.

Figure 2:
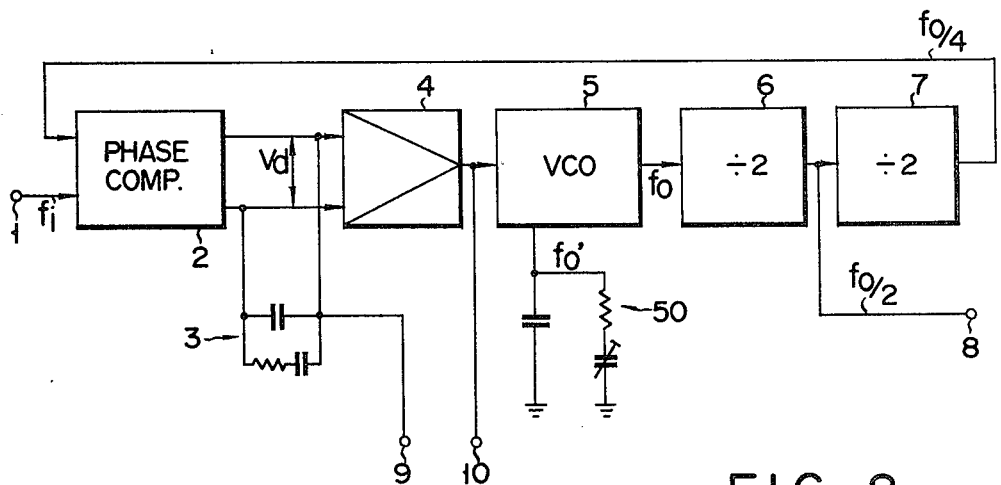
FIG. 2 is a block diagram of a typical PLL circuit.

The PLL circuit 20A, like the PLL circuit shown in FIG. 2, is comprised of a phase comparator 2A, a loop filter 3A, a DC amplifier 4A, a VCO 5A and ½ frequency-dividers 6A and 7A. Connected to the VCO 5A are an RC circuit 50Aa for setting the self-running frequency $f_o$ of VCO to approximately 126 kHz which is four times the sound subcarrier frequency of TV sound multiplex broadcasting, and an RC circuit 50Ab for setting it to approximately 76 kHz which is four times the pilot signal frequency of FM stereo broadcasting. Either of those RC circuits is effectively connected to VCO 5A by means of a switch S5. That is, when the switch S5 is thrown to a contact S5a, the self-running frequency of VCO 5A becomes about 126 kHz, and when it is thrown to a contact S5b, the self-running frequency is set to about 76 kHz. The frequency characteristic of the loop filter 3A is switched by a switch S6, so that the capture range of PLL circuit 20A is changed. Specifically, when the switch S6 is switched to its contact S6a, the capture range of PLL is set to a given frequency range with 31.5 kHz intervening therebetween. When the switch S6 is switched to its contact S6b, the capture range of PLL is set to another given frequency range with 19 kHz intervening therebetween which is preferably narrower than the former frequency range. To the output of frequency divider 6A is connected a third ½ frequency divider or binary counter 28A with a 90° phase-shift capability. Therefore, the output signal of the third frequency divider 28A is in quadrature phase with the output signal from the second frequency divider 7A. When the PLL circuit 20A is locked onto a signal from the frequency discriminator 14, the output signal from the third frequency divider 28A is in phase with the signal delivered from the frequency discriminator onto which the PLL circuit is locked. The output of third frequency divider 28A is coupled with the first detector circuit 21.

The output of first frequency divider 6A of PLL circuit 20A is coupled with a switching carrier input terminal of the stereo demodulator 18 through a control switch CS2 controlled by an output signal from first detector circuit 21. The output of DC amplifier 4A is coupled with a lowpass filter 29 whose output is connected through the above-mentioned control switch CS1 to the adder 24a and the subtractor 24b of the matrix circuit 27 and is connected to a subsound output terminal 30 through a control switch CS3 during the reception of the TV dual sound broadcasting. The control switches CS1 and CS3 are controlled by the second detector circuit 22 as described later.

The first detector circuit 21 is so adapted as to detect the presence or absence of a 31.5 kHz subcarrier signal or a 19 kHz pilot signal included in an output composite signal from the discriminator 14 for controlling an indicator 31 including a light emitting diode or the like and the control switch CS2. The first detector circuit 21 is comprised of a phase comparator 32A for phase-comparing the output signal from the discriminator 14 with the output signal from the third frequency divider 28 of PLL circuit 20A, a lowpass filter 33 coupled to phase comparator 32A, a voltage comparator 34A to which a phase error voltage from the comparator is applied through the lowpass filter 33A, and a driver circuit 35A to which the output voltage of comparator 34A is applied. The phase comparator 32A and the lowpass filter 33A form a synchronous detector which produces a detected output voltage when the output signal of discriminator 14 includes a signal component which has the same phase (frequency) as the output signal from the frequency divider 28A. The comparator 34A compares the detected output voltage with a voltage of a fixed level to produce a detected output signal when the former exceeds the latter. The driver circuit 35A is responsive to the detected signal to light the indicator 31 and to close the control switch CS2. In a signal path led from the driver circuit 35A to the control switch CS2, a switch S7 is placed which is closed when the FM broadcasting is selected.

The second detector circuit 22 is adapted to detect a modulation frequency of the control channel signal, which is included in the composite signal from the discriminator 14, for indicating whether the TV sound multiplex broadcasting is stereo broadcasting or dual sound broadcasting, so as to close the control switch CS1 or CS3. To this end, the second detector 22 is comprised of an amplifier 36 to amplify the output signal from the discriminator 14, a detector 37 for AM-detecting the control channel signal, a detector 38 for detecting the modulation frequency of 922.5 kHz, a detector 39 for detecting a modulation frequency of 982.5 Hz, and voltage comparators 40 and 41 which respectively compare the output voltages of the detector circuits 38 and 39 with a given reference voltage. The control switch CS1 is closed by the output voltage of the comparator 41 when the modulation frequency of 982.5 Hz (stereo broadcasting) is detected. The control switch CS3 is closed by the output voltage of comparator 40 when the modulation frequency of 922.5 Hz (dual sound broadcasting) is detected.

The switches S1 to S7 shown in FIG. 3 are interlocked with one another. The switches S1 to S6 are thrown to the fixed contacts with a suffix a attached thereto for receiving the TV sound while they are thrown to the fixed contacts with a suffix b for receiving the FM broadcasting. The switch S7 is open in receiving the TV sound while it is closed in receiving the FM broadcasting.

The operation of the receiver described referring to FIG. 3 will be described with reference to FIGS. 4A to 4E. Particularly FIGS. 4A and 4B respectively show conditions of the receiver when receiving an FM monophonic broadcasting and an FM stereophonic broadcasting. FIGS. 4C to 4E respectively show conditions of the receiver when receiving a TV sound stereophonic broadcasting, a TV dual sound broadcasting, and a TV sound monophonic broadcasting.

Figure 4A:
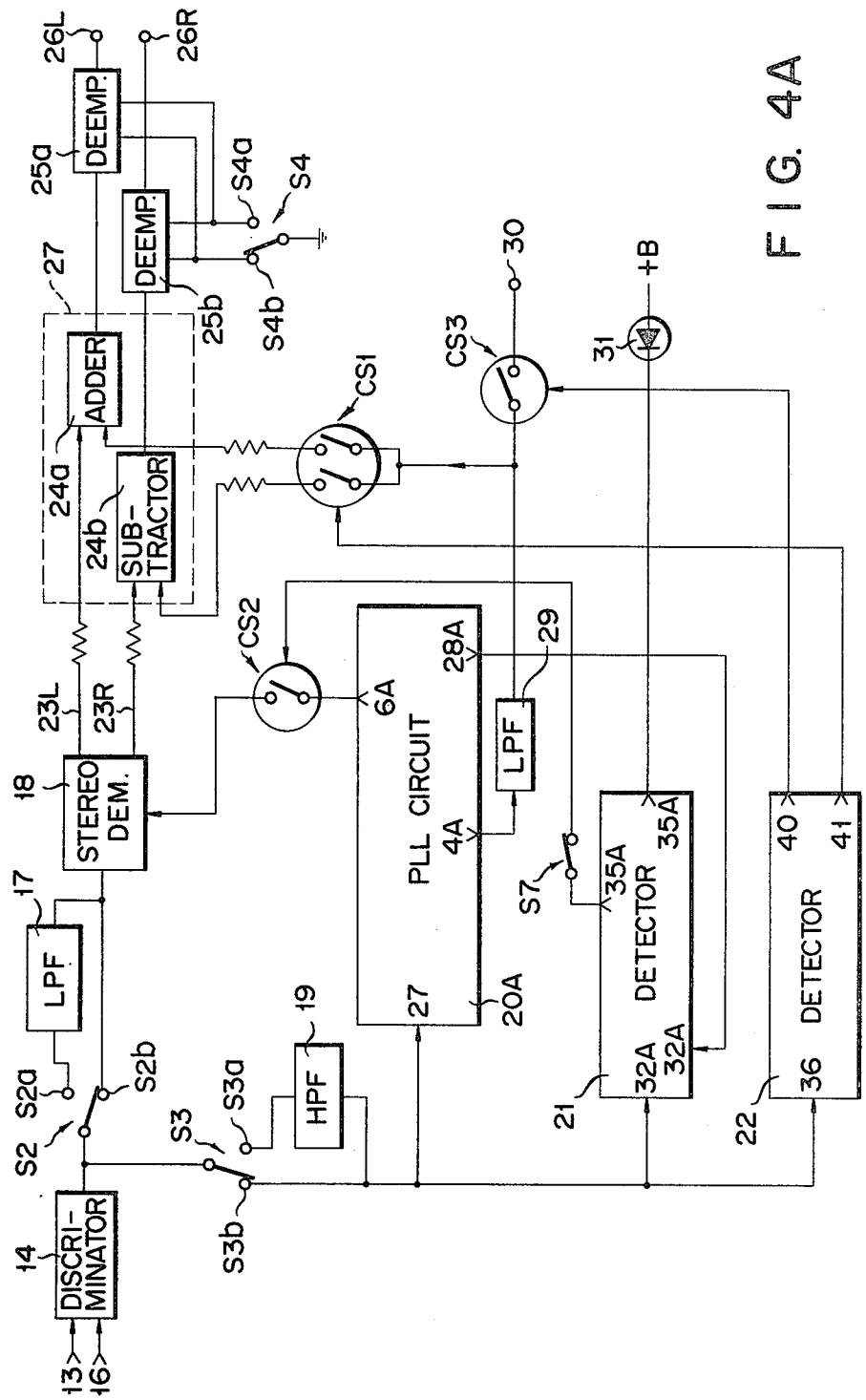
FIGS. 4A to 4E show diagrams useful in explaining the operation of the receiver shown in FIG. 3 during reception of FM monophonic broadcasting, FM stereo broadcasting, television sound stereo broadcasting, television dual sound broadcasting, and television sound monophonic broadcasting.
Figure 4B:
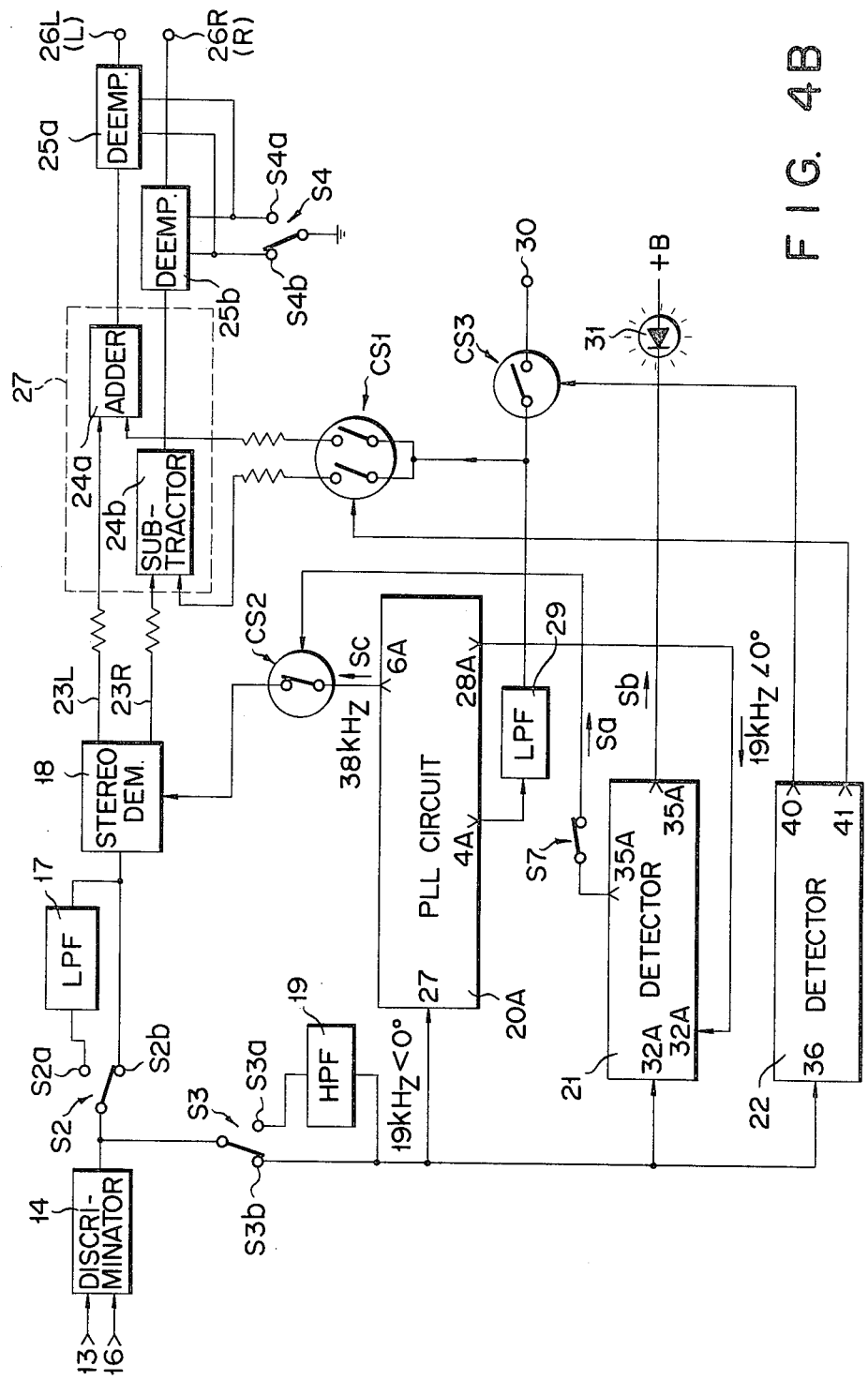
Figure 4C:
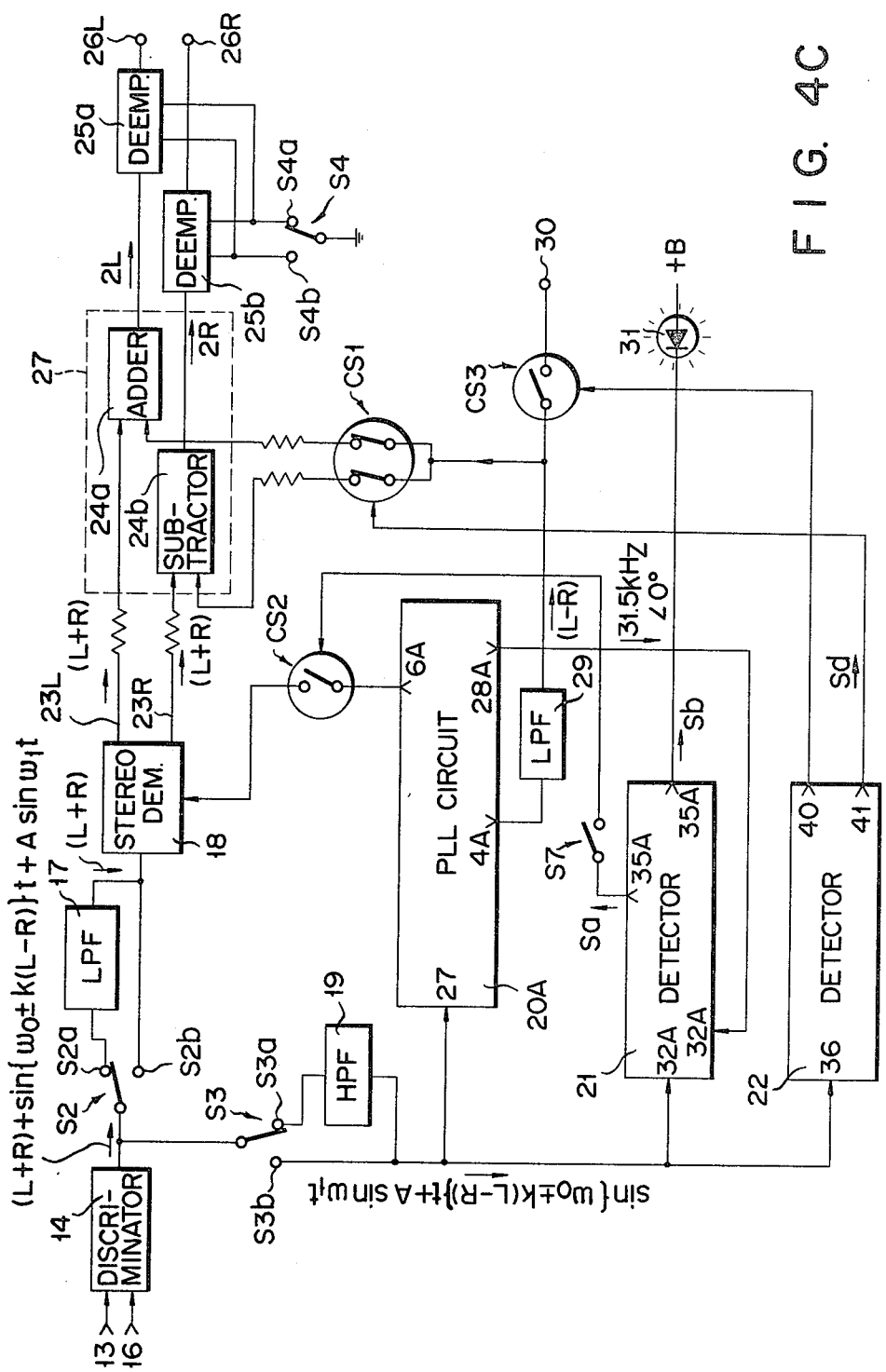
Figure 4D:
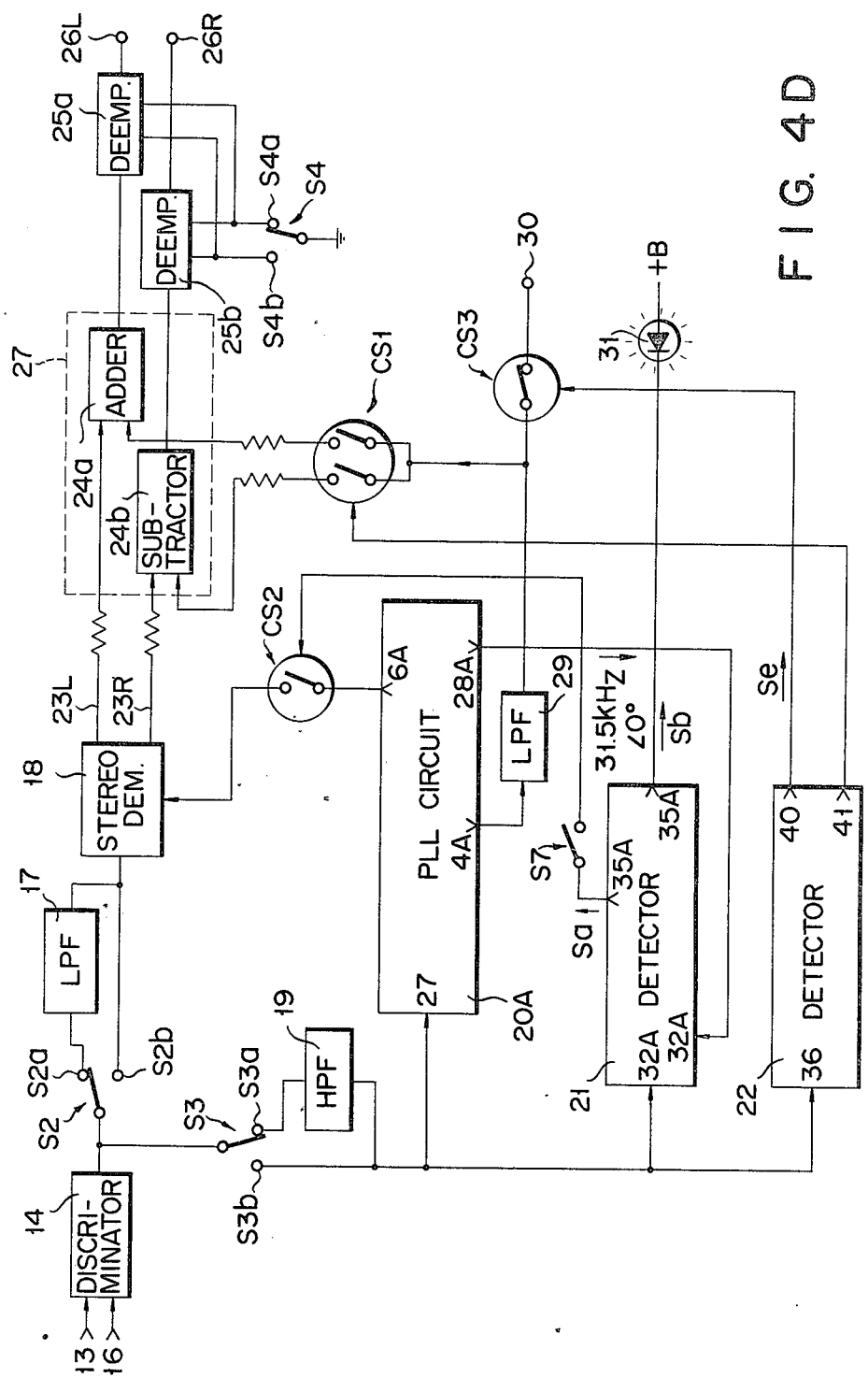
Figure 4E:
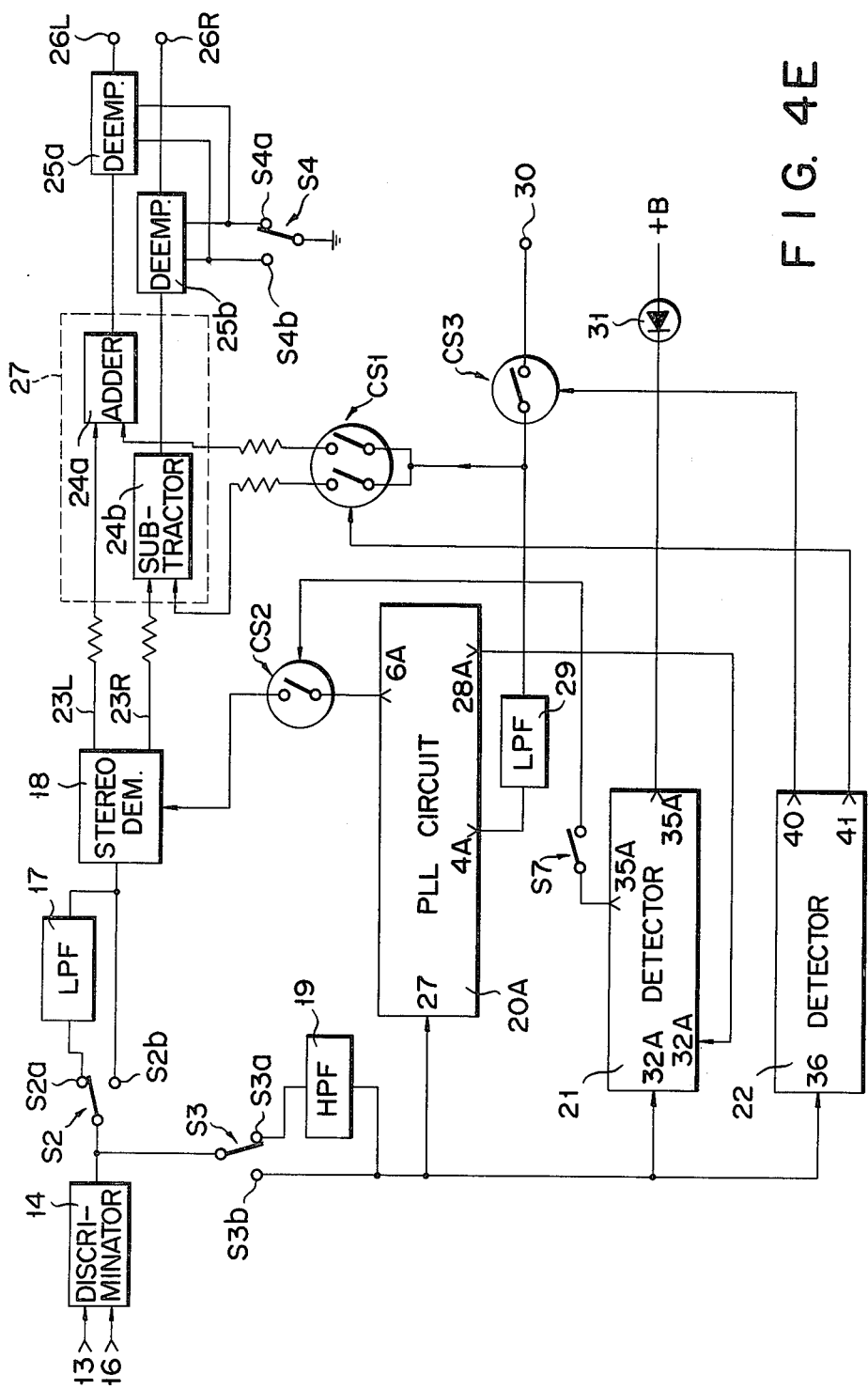

As shown in FIGS. 4A and 4B, in receiving the FM broadcasting, the output signal from the discriminator 14 is directly applied to the stereo demodulator 18, the first and second detectors 21 and 22 and the PLL circuit 20A. The frequency response of the deemphasis circuits 25a and 25b are set at 50 μs. In the PLL circuit 20A, the self-running frequency of VCO 5 is set to about 76 kHz and the capture range of the loop is set to a frequency range with 19 kHz intervening therebetween.

In the case of monophonic FM broadcasting, the pilot signal of 19 kHz is not included in the output signal from the discriminator 14 and therefore the PLL circuit 20A is not locked. Although the third frequency divider circuit 28A of PLL circuit 20A applies a frequency signal of about 19 kHz to the first detector circuit 21, the detector circuit 21 does not operate. Accordingly, the control switch CS2 is left open and the indicator 31 does not light up. Since the 38 kHz switching signal is not applied to the stereo demodulator 18, the monophonic output signal from the discriminator 14 appears at the output terminals 23L and 23R. Since the output signal from the discriminator 14 does not include a control channel signal, the second detector circuit 22 does not issue the detecting signal for 922.5 Hz or 982.5 kHz and therefore the control switches CS1 and CS3 are left open. Accordingly, the output signal from the stereo demodulator 18 is applied to the deemphasis circuit 25a and 25b, so that the monophonic audio signal is taken out from the output terminals 26L and 26R. At this time, no audio signal is taken out from the output terminal 30.

During the reception of FM stereo multiplex broadcasting, the output signal of discriminator 14 includes the 19 kHz pilot signal as shown in FIG. 4B. Accordingly, the PLL circuit 20A is locked and the oscillating frequency of VCO 5A becomes exactly 76 kHz. The third frequency divider 28A of PLL circuit 20A applies a 19 kHz signal in phase with the pilot signal to the phase comparator 32A of the first detector 21. Since the output signal of the discriminator 14 includes a 19 kHz pilot signal, the first detector 21 forms detecting signals Sa and Sb. Therefore, the control switch CS2 is closed and the indicator 31 lights. The frequency divider 6A of PLL circuit 20A applies a switching signal Sc of 38 kHz synchronized with the 19 kHz pilot signal to the stereo demodulator 18 through the control switch CS2. As a result, the output terminals 23L and 23R of the stereo demodulator 18 are alternately coupled to the input terminal thereof for each half cycle of the 38 kHz switching signal, so that separate left and right channel audio signals are taken out from the output terminals 23L and 23R, respectively. As in the case of the FM monophonic broadcasting reception, the second detecting circuit 22 does not operate and the control switches CS1 and Cs3 remain open. Accordingly, the deemphasized left and right channel audio signals L and R appear at the output terminals 26L and 26R, respectively.

The TV sound broadcasting reception will be described with reference to FIGS. 4C to 4E. The output signal of the discriminator 14 is applied to the stereo demodulator 18 through the lowpass filter 17 and to the PLL circuit 20A, and the first and second detecting circuits 21 and 22 through the highpass filter 19. Accordingly, only the main channel signal is applied to the stereo demodulator 18, and the subchannel signal and the control channel signal are applied to the PLL circuit 20A, and the first and the second detectors 21 and 22. The self-running frequency of VCO 5A of PLL circuit 20A is set to about 126 kHz which is four times the subcarrier frequency 31.5 kHz, and the capture range of PLL circuit is set to a frequency range including 31.5 kHz. The frequency response of each of the deemphasis circuits 25a and 25b is set to 75 μs. Since the switch S7 is open, the control switch CS2 is held open.

In the case of stereo broadcasting, the output signal of the discriminator 14 is expressed by $(L+R)+\sin\{\omega_o \pm k(L-R)\}t + A\sin\omega_1$, as shown in FIG. 4C. In the above formula, the first term represents the main channel signal; the second term the subchannel signal and the third term the control channel signal obtained by AM modulating the control subcarrier with a control signal of 982.5 Hz. The main channel signal (L+R) appears in the same proportion at the output terminals 23L and 23R of the stereo demodulator 18 to which the 38 kHz switching carrier is not applied.

When the subchannel signal is applied to the PLL circuit 20A, the PLL circuit may be locked onto about 31.5 kHz, the subcarrier frequency, so that an FM-demodulated output signal (L−R) is taken out from the DC amplifier 4A. The output signal (L−R) is applied to the control switches CS1 and CS3 through the lowpass filter 29. The control channel signal is applied to the second detector circuit 22 where the stereo control signal of 982.5 Hz is detected to issue a detection signal Sd to close the control switch CS1 from the comparator 41. Accordingly, the difference signal (L−R) is applied to the matrix circuit 27 through the lowpass filter 29 and the control switch CS1. In the matrix circuit 27, output signals 2L and 2R are produced through the process of addition and subtraction of the difference signal (L−R) to and from the sum signals so as to appear at the output terminals 26L and 26R through the deemphasis circuits 25a and 25b. Since a detection signal for 922.5 Hz is not obtained from the comparator 40 of second detector 22, the control switch CS3 is left open. Accordingly, any audio signal does not appear at the terminal 30. To the first detector circuit 21 is applied the subchannel signal from the discriminator 14 and 31.5 kHz signal from the PLL circuit 20A, so that the drive signal is taken out from the driver circuit 35A to light the indicator 31. Since the switch S7 is open when the TV sound broadcasting is received, the control switch CS2 remains open.

The TV dual sound broadcasting reception is different from the TV sound stereo broadcasting reception in the output state of the second detector circuit 22. In the case of the dual sound broadcasting, since the control signal is 922.5 Hz the comparator 40 produces a detection signal Se as shown in FIG. 4D. Accordingly, the control switch CS3 is closed and the control switch CS1 remains open. Accordingly, the subsound signal FM-demodulated by the PLL circuit 20A is led to the output terminal 30 but it is not applied to the matrix circuit 27. The main sound signal appears at the output terminals 23L and 23R of the stereo demodulator 18 and then is led to the output terminals 26L and 26R through the deemphasis circuits 25a and 15b, respectively. The indicator 31 is lit by the output signal of the first detecting circuit 21, as in the case of the TV sound broadcasting.

In the case of the monophonic TV sound broadcasting, the output signal of the discriminator 14 is applied to only the stereo demodulator 18 and not to the PLL circuit 20A and the first and second detector circuits 21 and 22. Accordingly, there is no signal taken out from the PLL circuit 20A through the lowpass filter 29. Since the first and second detector circuits 21 and 22 do not operate, the control switches CS1, CS3 and CS3 are left open and the indicator 31 does not light as shown in FIG. 4E. Accordingly, the main channel signal or monophonic audio signal from discriminator 14 appears at the output terminals 23L and 23R of stereo demodulator 18 and is delivered through the deemphasis circuits 25a and 25b to the output terminals 26L and 26R.

Figure 5:
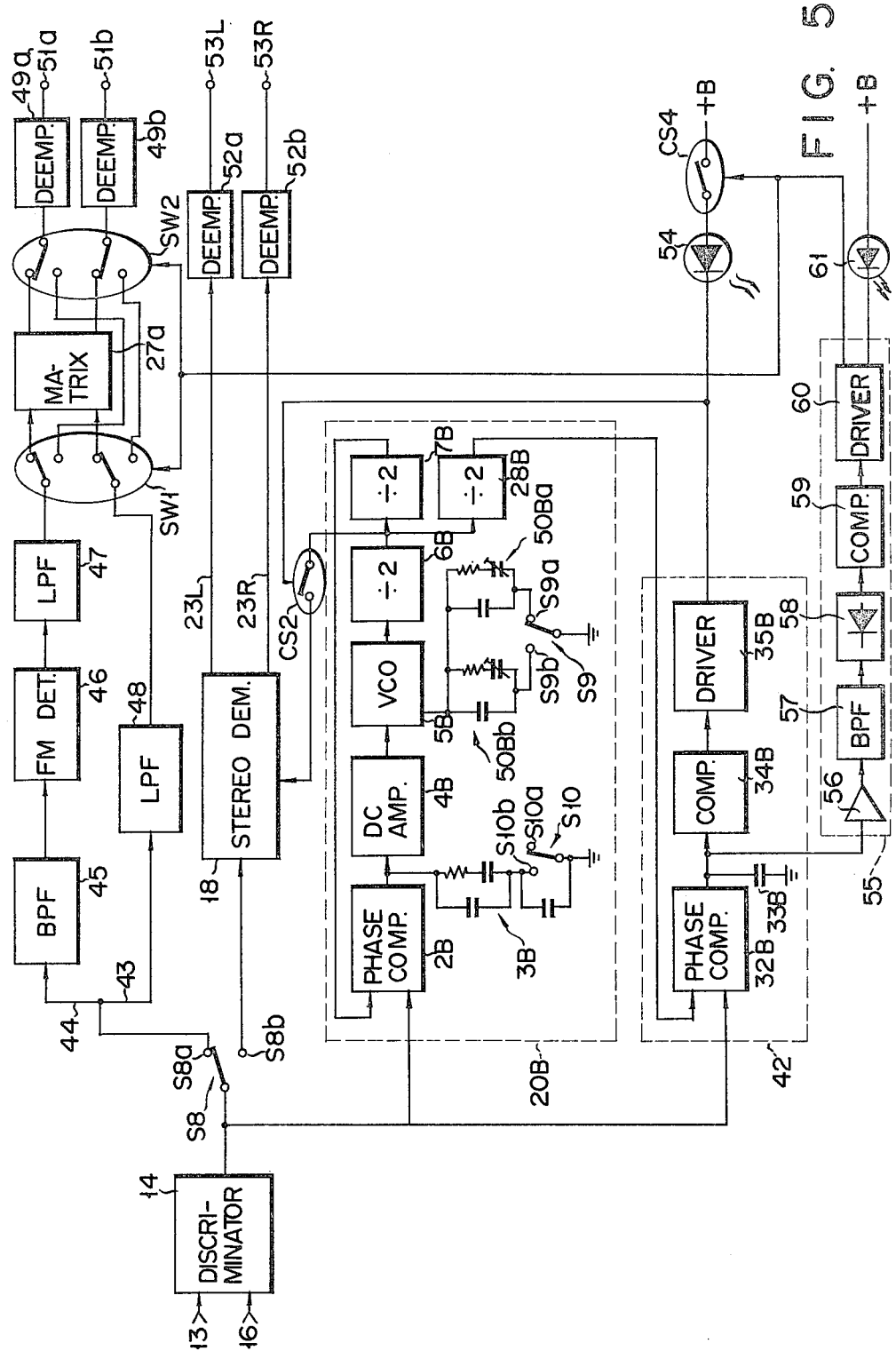
FIG. 5 is a block diagram of a receiver according to a second embodiment of the invention.

Referring to FIG. 5 there will now be described a receiver according to the second embodiment of the invention in which the PLL circuit is adapted to produce the 38 kHz switching carrier signal during the reception of FM stereo broadcasting and to detect the control channel signal during the reception of TV sound multiplex broadcasting. In the receiver of this embodiment, the same circuits as those in FIG. 3 are provided at the prestage of the discriminator 14, although such circuits are not illustrated in FIG. 5. The output of discriminator 14 is coupled to a PLL circuit 20B, a third detector circuit 42 and a switch S8. The switch S8 is provided with a fixed contact S8a for TV sound reception and a fixed contact S8b for FM broadcasting reception. The contact S8a is connected to a main channel signal path 43 and a subchannel signal path 44. In the subchannel signal path 44, a bandpass filter 45, an FM detector 46 and a lowpass filter 47 are arranged. The main channel signal path 43 includes a lowpass filter 48 allowing only the main channel signal to pass therethrough. The outputs of lowpass filters 47 and 48 are connected to a series connection including a selection switch SW1, a matrix circuit 27a, and a selection switch SW2 arranged in this order. The switch SW2 is connected to output terminals 51a and 51b via deemphasis circuits 49a and 49b. The circuit led from the fixed contact S8a of the switch S8 to the output terminals 51a and 51b is the same as the conventional TV sound multiplex signal demodulation circuit.

The fixed contact S8b of switch S8 is connected to a switching type stereo demodulator 18 whose outputs 23L and 23R are connected to the output terminals 53L and 53R through deemphasis circuits 52a and 52b, respectively.

The PLL circuit 20B is provided with a phase comparator 2B, a lowpass filter 3B, a DC amplifier 4B, a VCO 5B, and first to third ½ frequency dividers 6B, 7B and 28B, as in the PLL circuit 20A shown in FIG. 3. To the VCO 5B is externally connected a couple of RC circuits 50Ba and 50Bb. The RC circuit 50Ba is used to set the self-running frequency of VCO 5B to 220.5 kHz which is four times the control subcarrier frequency 55.125 kHz of the television sound multiplex broadcasting; the RC circuit 50Bb is used to set the self-running frequency of VCO 5B to 76 kHz which is four times the pilot signal frequency of FM stereo broadcasting. The RC circuits 50Ba and 50Bb are selectively connected to VCO 5B by means of switch S9. A switch S10 connected to the loop filter 3B suitably changes the capture range of PLL circuit to a frequency range including 55.125 kHz or 19 kHz. The output of the first frequency divider 6B is connected through the control switch CS2 to the switching carrier terminal of stereo demodulator 18.

The third detector circuit 42 is so adapted as to detect the control channel signal centered at 55.125 kHz and is comprised of a phase comparator 32B, a lowpass filter 33B, a voltage comparator 34B and driver circuit 35B as in the first detector 21 in FIG. 3. An indicator 54 and a normally closed control switch CS4 are connected in series with the driver circuit 35B. When the switch CS4 is open, the indicator 54 does not light regardless of the output condition of driver circuit 35B.

The lowpass filter 33B of third detector circuit 42 is coupled with a fourth detector circuit 55 which is adapted so as to detect either the control signal frequency 982.5 Hz or 922.5 Hz of the TV sound multiplex broadcasting, and is comprised of an amplifier 56, a bandpass filter 57 to permit either 982.5 Hz or 922.5 Hz to pass therethrough, an AM detector 58, a voltage comparator 59, and a driver circuit 60. The driver circuit 60 is connected to an indicator 61, the switches SW1 and SW2, and the control switch CS4.

In operation of the receiver shown in FIG. 5, in order to receive the FM radio broadcasting, the interlocked switches S1 (FIG. 3), S8, S9 and S10 are thrown to the fixed contacts S1b, S8b, S9b and S10b, respectively. Accordingly, the output signal of the discriminator 14 is applied to the stereo demodulator 18. When the FM radio broadcasting is the stereo broadcasting, the PLL circuit 20B produces a 38 kHz switching carrier signal synchronized with the pilot signal at the output of the frequency divider 6B. Since the frequency divider 28B of PLL circuit 20B applies a 19 kHz signal in phase with the pilot signal to the phase comparator 32B of detector circuit 42, a synchronous detector including the phase comparator 32B and the lowpass filter 33B forms an output signal. As a result, the control switch CS2 is closed and the 38 kHz switching signal is applied to the stereo demodulator 18. In the detector circuit 55, since the modulation frequency of 922.5 Hz or 982.5 Hz is not detected, the control switch CS4 remains closed and thus the indicator 54 is lit while the indicator 64 is not lit.

When the FM radio broadcasting is monophonic the detector circuits 42 and 55 do not perform detecting operation. Accordingly, the control switch CS2 is left open so that a switching signal is not applied to the stereo demodulator 18. For this reason, the monophonic audio output signal from the discriminator 14 appears at the outputs 23L and 23R of the stereo demodulator 18 and then is sent forth through the deemphasis circuits to the output terminals 53L and 53R. Both the indicators 54 and 61 are not lit.

To receive the TV sound broadcasting, the switches S1, S8, S9 and S10 are thrown to the fixed contacts S1a, S8a, S9a and S10a, respectively. The self-running frequency of PLL circuit 20B is set to about 220.5 kHz. In receiving TV sound multiplex broadcasting, the PLL circuit 20B is locked onto 55.125 kHz, the control subcarrier frequency and a 55.125 kHz signal in phase with the control subcarrier signal included in the output signal of the discriminator 14 is applied from the frequency divider 28B to the phase comparator 32B connected to the output of discriminator 14. Accordingly, the synchronous-detected output signal is taken out from the phase comparator 32B and the lowpass filter 33B. The synchronous-detected output includes a modulation signal component of 922.5 Hz or 982.5 Hz for the control subcarrier. Therefore, if the bandpass filter 57 is so designed as to permit only the control signal of 982.5 Hz (stereo control signal) to pass therethrough, a drive signal is taken out from the driver circuit 60 during the reception of the stereo broadcasting so that the indicator 61 is lit and the control switch CS4 opens. As a result, the indicator 54 is not lit during the reception of stereo broadcasting. In receiving the dual sound broadcasting, the drive signal is not taken out from the driver circuit 60, so that the indicator 61 is not lit. However, the indicator 54 is lit since the switch CS4 is closed. When the detector circuit 55 is so designed as to detect the modulation frequency of 922.5 Hz, the indicator 61 lights but the indicator 54 does not light in receiving the dual sound broadcasting.

In receiving the TV sound multiplex broadcasting, the subsound signal and the main sound signal are taken out from the lowpass filters 47 and 48, respectively. In response to the output of the detector circuit 55, the selection switches SW1 and SW2 are so controlled as to couple the outputs of the lowpass filters 47 and 48 to the matrix circuit 27a and further the outputs of matrix circuit 27a to the deemphasis circuits 49a and 49b for the purpose of stereo broadcasting reception. On the other hand, for the purpose of reception of the dual sound broadcasting, the selection switches SW1 and SW2 couple the outputs of the lowpass filters 47 and 48 directly to the deemphasis circuits 49a and 49b, respectively. Therefore, the right and left audio signals are taken out from the output terminals 51a and 51b, respectively during the reception of the stereo broadcasting while the main sound signal and the subsound signal are taken out from the output terminals 51b and 51a, respectively, during the reception of the dual sound broadcasting.

Figure 6:
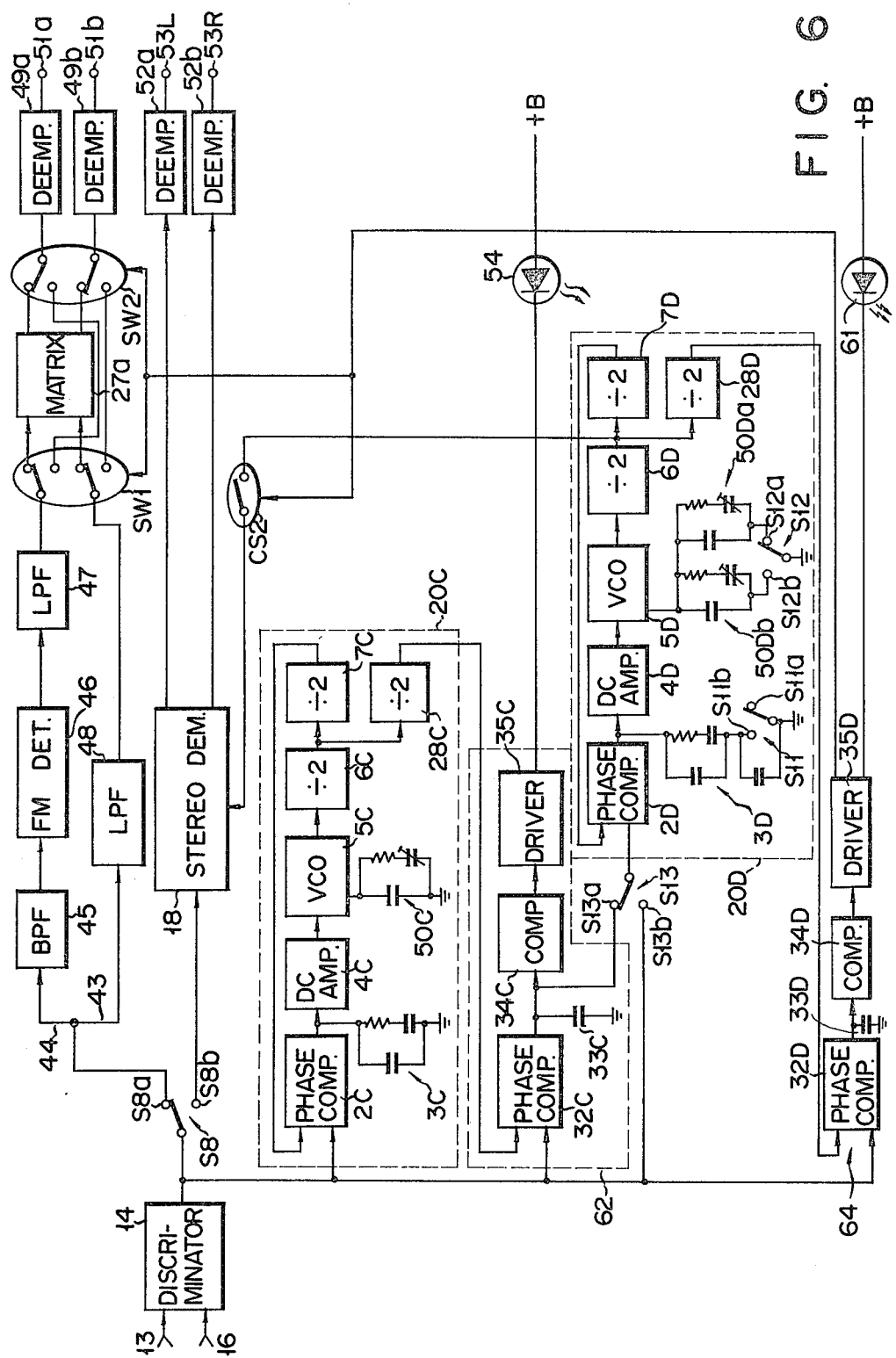
FIG. 6 is a block diagram of a receiver according to a third embodiment of the invention.

Referring now to FIG. 6, there is shown a third embodiment of a receiver according to the invention in which a PLL circuit for forming a 38 kHz switching signal in receiving the FM broadcasting is used to detect whether a TV sound multiplex broadcasting being received is stereo broadcasting or dual sound broadcasting. In FIG. 6, the circuits, though not shown, at the prestage of discriminator 14 are the same as those shown in FIG. 3, and further a TV sound multiplex signal demodulator circuit and an FM stereo multiplex signal demodulator circuit are the same as those shown in FIG. 5, the description thereof being omitted.

The output of discriminator 14 is connected to a first PLL circuit 20c and a detector circuit 62. The first PLL circuit 20c is comprised of a phase comparator 2c, a loop filter 3c, a DC amplifier 4c, a VCO 5c, an RC circuit 50c externally connected to VCO 5c, and first to third frequency dividers 6c, 7c and 28c. The RC circuit 50c sets the self-running frequency of VCO 5c to about 220.5 kHz which is four times the control subcarrier frequency 55.125 kHz for TV sound multiplex broadcasting. Accordingly, the first PLL circuit 20c is locked onto the control subcarrier frequency when the TV sound multiplex broadcasting is received, so that a 55.125 kHz signal in phase with the control subcarrier signal is taken out from the frequency divider 28c having a 90° phase-shift capability. The detector circuit 62 is comprised of a phase comparator 32c, a lowpass filter 33c, a voltage comparator 34c and a driver circuit 35c as in the detector circuit 42 shown in FIG. 5. The detector circuit 62 synchronous-detects the control channel signal centered at 55.125 kHz included in the output signal of discriminator 14 to light an indicator 54 connected to the detector circuit 62. A second PLL circuit 20D, provided in the receiver shown in FIG. 6, is selectively connected to the output of discriminator 14 or the lowpass filter 33c through the operation of switch S13. The second PLL cricuit 20D, like the PLL circuit shown in FIG. 5, is comprised of a phase comparator 2D, a loop filter 3D, a switch S11 for switching the frequency characteristic of the loop filter, a DC amplifier 4D, a VCO 5D, and RC circuit 50Da for setting the self-running frequency of VCO 5D to 3.93 kHz or 3.69 kHz which is four times the control signal frequency 982.5 Hz or 922.5 Hz of the TV sound multiplex broadcasting, an RC circuit 50Db for setting the self-running frequency of VCO 5D to 76 kHz which is four times the pilot signal frequency 19 kHz of the FM stereo broadcasting, a switch S12 for effectively connecting one of the RC circuits 50Da and 50DB to VCO 5D, and first to third ½ frequency dividers 6D, 7D and 28D. The output of frequency divider 6D is applied through the control switch CS2 to the switching carrier input terminal of the stereo demodulator 18. The output of frequency divider 28D is connected to a phase comparator 32 of a detector circuit 64 which includes a phase comparator 32D, a lowpass filter 33D, a voltage comparator 34D and a driver circuit 35D. The detector circuit 64 synchronous-detects by a signal from the frequency divider 28D the 19 kHz pilot signal in the FM stereo broadcasting included in the signal derived from the discriminator 14 or a modulation component (922. Hz or 982.5 Hz) of the control channel signal in the TV sound multiplex broadcasting to light the indicator 61 and produce a drive signal for closing the control switch CS2 and controlling the matrix selection switches SW1 and SW2.

In operation of the receiver shown in FIG. 6, to receive the FM radio broadcasting, the interlocked switches S1 (FIG. 3), S8, S11, S12 and S13 are thrown to the fixed contacts S1b, S8b, S11b, S12b, and S13B, respectively. When the FM radio broadcasting is received, a signal of about 55.125 kHz is not included in the output signal of the discriminator 14. Therefore, the PLL circuit 20c is not locked so that VOC 5c oscillates at the self-running frequency. Although a signal of about 55.125 kHz is applied to the phase comparator 32c from the frequency divider 28c, the detector circuit 62 does not operate, so that the indicator 54 does not light. Since the self-running frequency of VCO 5D is set to about 76 kHz the PLL circuit 20D is locked onto the 19 kHz pilot signal included in the output signal of the discriminator 14. The 19 kHz output signal of the frequency divider 28D is applied to the phase comparator 32D, so that the detector 64 detects the 19 kHz pilot signal from the discriminator 14. As a result, in response to the output of the driver circuit 35D, the indicator 61 lights and the control switch CS2 is closed. Closing of the control switch CS2 applies the 38 kHz switching carrier to the stereo demodulator 18. As a result, the stereo demodulator 18 separates the stereo composite signal into the right and left channel audio signals. When the FM radio broadcasting is the monophonic broadcasting, the pilot signal is not included in the output signal of the discriminator 14, with the result that the indicator 61 is not lit and the control switch CS2 is left open.

For reception of the TV sound broadcasting, the switches S1, S8, S11, S12 and S13 are thrown to the fixed contacts S1b, S8a, S11, S12a and S13a, respectively. During the reception of TV sound multiplex broadcasting, the discriminator 14 applies to the PLL circuit 20C a control channel signal centered at 55.125 kHz, so that the PLL circuit 20C is locked onto 55.125 kHz. Since the 55.125 kHz signal is applied to the phase comparator 32C from the frequency divider 28C, the detector 62 forms a detection signal to light the indicator 54. As a result of the synchronous detection, a modulation frequency component of 982.5 Hz or 955.5 Hz is taken out from the lowpass filter 33c of the detector circuit 62 and then applied to the PLL circuit 20D. The VCO 5D of PLL circuit 20D has the self-running frequency set to about the frequency four times 982.5 Hz or 922.5 Hz by means of the RC circuit 50DA. If the self-running frequency of VCO 5D is four times the stereo control signal frequency 982.5 Hz, the PLL circuit 20D is locked onto the 982.5 Hz signal component derived from the lowpass filter 33C in the stereo broadcasting. As a result, the frequency divider 28D applies a 982.5 Hz signal to the phase detector 32D where the 982.5 Hz control signal component included in the output signal of the discriminator 14 is synchronous-detected. As a result of the synchronous detection, the detector circuit 64 produces a detection signal to light the indicator 61 and to actuate the matrix selection switches SW1 and SW2 so as to couple the outputs of lowpass filters 47 and 48 to the matrix circuit 27a and couple the outputs of matrix circuit 27a to the deemphasis circuits 49a and 49b. Through this operation, the output signals (L−R) and (L+R) from the lowpass filters 47 and 48 are matrixed so that the right and left channel audio signals are obtained from the output terminals 51a and 51b. In the dual sound broadcasting, the 982.5 Hz component is not included in the output signal of the lowpass filter 33c of the detector circuit 62 and therefore the PLL circuit 20D is not locked. For this reason, the detector circuit 64 is not operated and thus the indicator 61 is not lit. The matrix selection switches SW1 and SW2 are so controlled as to couple directly the outputs of lowpass filters 47 and 48 to the deemphasis circuits 49a and 49b. Therefore, the main sound signal appears at the output terminal 51b while the subsound signal appears at the output terminal 51a.

In the receiver shown in FIG. 6, the self-running frequency of VCO 5D of PLL circuit 20D may be set to the frequency approximately four times the dual sound control signal frequency 922.5 Hz. In this case, the PLL circuit 20D is locked during the reception of the dual sound broadcasting, so that the detector circuit 64 operates to light the indicator 61. When the detector circuit 64 detects the dual sound control signal, the matrix selection switches SW1 and SW2 are so controlled as to couple the outputs of the lowpass filters 47 and 48 directly to the deemphasis circuits 49a and 49b.

What is claimed is:

1. A receiver for selectively receiving either a television sound multiplex broadcasting in which a main carrier is frequency-modulated by a television sound multiplex composite signal including a main channel signal of a first audio signal and a subchannel signal formed by frequency-modulating a subcarrier with a second audio signal, or an FM stereo multiplex broadcasting in which a main carrier is frequency-modulated by an FM stereo multiplex composite signal including a main channel signal which is the sum of left and right channel audio signals, a subchannel signal formed by suppressed-carrier amplitude-modulating a subcarrier with the difference between the left and right channel audio signals and a pilot signal having a frequency half the frequency of the subcarrier, said receiver comprising:

frequency discriminator means for recovering the television sound multiplex composite signal during the reception of the television sound multiplex broadcasting and the FM stereo multiplex composite signal during the reception of the FM stereo multiplex broadcasting;

PLL circuit means coupled with said frequency discriminator means and including a voltage-controlled oscillator, and circuit means connected to said oscillator for selectively setting the self-running frequency of said oscillator to a frequency corresponding to the frequency of the subcarrier in the television sound multiplex broadcasting for the purpose of receiving the television sound multiplex broadcasting or a frequency corresponding to the frequency of the pilot signal in the FM stereo multiplex broadcasting for the purpose of receiving the FM stereo multiplex broadcasting, whereby said PLL circuit means FM-demodulates the subchannel signal during the reception of the television sound multiplex broadcasting and forms a switching carrier signal with a frequency two times the frequency of the pilot signal during the reception of the FM stereo multiplex broadcasting.

2. The receiver according to claim 1, further comprising:

detector circuit means connected to said PLL circuit means and to said frequency discriminator means for detecting whether the television sound multiplex broadcasting or the FM stereo multiplex broadcasting is received; and indicator means coupled to said detector means for indicating either the television sound multiplex broadcasting or the FM stereo multiplex broadcasting is received.

3. A receiver for selectively receiving either a television sound multiplex broadcasting including a stereo broadcasting and a dual sound broadcasting in which a main carrier is frequency-modulated by a television sound multiplex composite signal having a main channel signal which is the sum of right and left channel audio signals in the stereo broadcasting or a main sound signal in the dual sound broadcasting, a subchannel signal formed by frequency-modulating a subcarrier with the difference between the right and left channel audio signals in the stereo broadcasting or a subsound signal in the dual sound broadcasting, and a control channel signal formed by amplitude-modulating a control subcarrier with a first control signal in the stereo broadcasting or a second control signal in the dual sound broadcasting, said first and second control signals having different frequencies, or an FM stereo multiplex broadcasting in which a main carrier is frequency-modulated by an FM stereo multiplex composite signal including a main channel signal which is the sum of left and right channel audio signals, a subchannel signal formed by suppressed-carrier amplitude-modulating a subcarrier with the difference between the right and left channel audio signals, and a pilot signal with a frequency which is half the frequency of the subcarrier, said receiver comprising:

frequency discriminator means for recovering the television sound multiplex composite signal during the reception of the television sound multiplex broadcasting and the FM stereo multiplex composite signal during the reception of the FM stereo multiplex broadcasting;

PLL circuit means coupled to said frequency discriminator means and including a voltage-controlled oscillator, and circuit means connected to said oscillator for selectively setting the self-running frequency of said oscillator to a frequency corresponding to the frequency of the subcarrier in the television multiplex broadcasting for the purpose of receiving the television sound multiplex broadcasting or a frequency corresponding to the frequency of the pilot signal in the FM stereo multiplex broadcasting for the purpose of receiving the FM stereo multiplex broadcasting, whereby said PLL circuit means FM-demodulates the subchannel signal during the reception of the television sound multiplex broadcasting and forms a switching carrier signal with a frequency which is two times the frequency of the pilot signal during the reception of the FM stereo multiplex broadcasting;

detector circuit means connected to said frequency discriminator means for detecting whether the television sound multiplex broadcasting being received is the stereo broadcasting or the dual sound broadcasting;

a stereo demodulator connected to receive the FM stereo multiplex composite signal from said discriminator means and the switching carrier signal from said PLL circuit means during the reception of the FM stereo multiplex broadcasting for separating the stereo composite signal into the right and left channel audio signals;

matrix circuit means connected to receive the main channel signal in the television sound multiplex composite signal from said discriminator means during the reception of the television sound multiplex broadcasting, and the FM-demodulated subchannel signal from said PLL circuit means when the television sound multiplex broadcasting being received is detected as the stereo broadcasting by said detector circuit for matrixing the main channel signal and the FM-demodulated subchannel signal to obtain the separate right and left channel audio signals; and means for introducing the FM-demodulated subchannel signal from said PLL circuit means to a subsound output terminal when the television sound multiplex broadcasting being received is detected as the dual sound broadcasting by said detector circuit.

4. A receiver for selectively receiving either a television sound multiplex broadcasting including a stereo broadcasting and a dual sound broadcasting in which a main carrier is frequency-modulated by a television sound multiplex composite signal having a main channel signal which is the sum of right and left channel audio signals in the stereo broadcasting or a main sound signal in the dual sound broadcasting, a subchannel signal formed by frequency-modulating a subcarrier with the difference between the right and left channel audio signals in the stereo broadcasting or a subsound signal in the dual sound broadcasting, and a control channel signal formed by amplitude-modulating a control subcarrier with a first control signal in the stereo broadcasting or a second control signal in the dual sound broadcasting, said first and second control signals having different frequencies, or an FM stereo multiplex broadcasting in which a main carrier is frequency-modulated by an FM stereo multiplex composite signal including a main channel signal which is the sum of left and right channel audio signals, a subchannel signal formed by suppressed-carrier amplitude-modulating a subcarrier with the difference between the right and left channel audio signals, and a pilot signal with a frequency which is half the frequency of the subcarrier, said receiver comprising:

frequency discriminator means for recovering the television sound multiplex composite signal during the reception of the television sound multiplex broadcasting and the FM stereo multiplex composite signal during the reception of the FM stereo multiplex broadcasting;

PLL circuit means coupled to said frequency discriminator means and including a voltage-controlled oscillator, and first circuit means connected to said oscillator for selectively setting the self-running frequency of said oscillator to a frequency corresponding to the frequency of the control subcarrier in the television sound multiplex broadcasting for the purpose of receiving the television sound multiplex broadcasting or a frequency corresponding to the frequency of the pilot signal in the FM stereo multiplex broadcasting for the purpose of receiving the FM stereo multiplex broadcasting, whereby said PLL circuit means produces a first signal which is in phase with the control subcarrier in the television sound multiplex composite signal from said frequency discriminator means during the reception of the television sound multiplex broadcasting, and produces a second signal which is in phase with the pilot signal in the FM stereo multiplex composite signal from said frequency discriminator means and a third signal which is synchronized with the pilot signal and has a frequency which is two times the frequency of the pilot signal during the reception of the FM stereo multiplex broadcasting.

5. The receiver according to claim 4 further comprising:

second circuit means connected to said frequency discriminator means to and said PLL circuit means for detecting the pilot signal from said discriminator means in response to the second signal from said PLL circuit means during the reception of the FM stereo multiplex broadcasting, and AM demodulating the control channel signal from said discriminator means to recover a control signal in response to the first signal from said PLL circuit means during the reception of the television sound multiplex broadcasting;

third circuit means connected to said second circuit means for detecting the frequency of the recovered control signal;

first demodulator means connected to receive the FM stereo multiplex composite signal from said discriminator means and the third signal from said PLL circuit means during the reception of the FM stereo multiplex broadcasting for separating the FM stereo multiplex composite signal into the left and right channel audio signals; and second demodulator means connected to receive the television sound multiplex composite signal from said discriminator means during the reception of the television sound multiplex broadcasting for demodulating the television sound multiplex composite signal, said second demodulator means including filter means for separating the composite signal into the main channel signal and the subchannel signal, FM-demodulator means connected to receive the subchannel signal for FM-demodulating the subchannel signal, and matrix circuit means for matrixing the main channel signal and FM demodulated subchannel signal to recover the left and right channel audio signals when the frequency of the control signal detected by said third circuit means is the frequency of said first control signal.

6. A receiver for selectively receiving either a television sound multiplex broadcasting including a stereo broadcasting and a dual sound broadcasting in which a main carrier is frequency-modulated by a television sound multiplex composite signal having a main channel signal which is the sum of right and left channel audio signals in the stereo broadcasting or a main sound signal in the dual sound broadcasting, a subchannel signal formed by frequency-modulating a subcarrier with the difference between the right and left channel audio signals in the stereo broadcasting or a subsound signal in the dual sound broadcasting, and a control channel signal formed by amplitude-modulating a control subcarrier with a first control signal in the stereo broadcasting or a second control signal in the dual sound broadcasting, said first and second control signals having different frequencies, or an FM stereo multiplex broadcasting in which a main carrier is frequency-modulated by an FM stereo multiplex composite signal including a main channel signal which is the sum of left and right channel audio signals, a subchannel signal formed by suppressed-carrier amplitude-modulating a subcarrier with the difference between the right and left channel audio signals, and a pilot signal with a frequency which is half the frequency of the subcarrier, said receiver comprising:

frequency discriminator means for recovering the television sound multiplex composite signal during the reception of the television sound multiplex broadcasting and the FM stereo multiplex composite signal during the reception of the FM stereo multiplex broadcasting;

first circuit means connected to said frequency discriminator means for recovering one of the first and second control signals from the control channel signal during the reception of the television sound multiplex broadcasting;

PLL circuit means selectively connected to said frequency discriminator means or to said first circuit means and arranged to be selectively locked onto the pilot signal or one of the first and second control signals, said PLL circuit means producing a first signal which is synchronized with the pilot signal and has a frequency which is two times the frequency of the pilot signal and a second signal which is in phase with the pilot signal when connected to said frequency discriminator means during the reception of the FM stereo multiplex broadcasting, and a third signal which is in phase with the recovered control signal from said first circuit means when connected to said first circuit means during the reception of the television sound multiplex broadcasting.

7. The receiver according to claim 6 further comprising:

second circuit means connected to said frequency discriminator means and to said PLL circuit means for detecting the pilot signal in response to the second signal from said PLL circuit means during the reception of the FM stereo multiplex broadcasting and the control signal in response to the third signal from said PLL circuit means during the reception of the television sound multiplex broadcasting;

first demodulator means connected to receive the FM stereo multiplex composite signal from said frequency discriminator means and the first signal from said PLL circuit means during the reception of the FM stereo multiplex broadcasting for separating the FM stereo composite signal into the left and right channel audio signals; and second demodulator means connected to receive the television sound multiplex composite signal from said discriminator means during the reception of the television sound multiplex broadcasting for demodulating the television sound multiplex composite signal, said second demodulator means including filter means for separating the composite signal into the main channel signal and the subchannel signal, FM demodulator means connected to receive the subchannel signal for FM demodulating the subchannel signal, and matrix circuit means for matrixing the main channel signal and FM demodulated subchannel signal to recover the left and right channel audio signals in response to said second circuit means when the control signal recovered by said first circuit means is said first control signal in the stereo broadcasting.

8. A receiver for selectively receiving either a television sound multiplex broadcasting including a stereo broadcasting and a dual sound broadcasting in which a main carrier is frequency-modulated by a television sound multiplex composite signal having a main channel signal which is the sum of right and left channel audio signals in the stereo broadcasting or a main sound signal in the dual sound broadcasting, a subchannel signal formed by frequency-modulating a subcarrier with the difference between the right and left channel audio signals in the stereo broadcasting or a subsound signal in the dual sound broadcasting, and a control channel signal formed by amplitude-modulating a control subcarrier with a first control signal in the stereo broadcasting or a second control signal in the dual sound broadcasting, said first and second control signals having different frequencies, or an FM stereo multiplex broadcasting in which a main carrier is frequency-modulated by an FM stereo multiplex composite signal including a main channel signal which is the sum of left and right channel audio signals, a subchannel signal formed by suppressed-carrier amplitude-modulating a subcarrier with the difference between the right and left channel audio signals, and a pilot signal with a frequency which is half the frequency of the subcarrier, said receiver comprising:

frequency discriminator means for recovering the television sound multiplex composite signal during the reception of the television sound multiplex broadcasting and the FM stereo multiplex composite signal during the reception of the FM stereo multiplex broadcasting; and PLL circuit means coupled to said frequency discriminator means and including a voltage-controlled oscillator, and circuit means connected to said oscillator for selectively setting the self-running frequency of said oscillator to a frequency corresponding to the frequency of the pilot signal in the FM stereo multiplex broadcasting for the purpose of receiving the FM stereo multiplex broadcasting or a frequency corresponding to the frequency of one of said subcarrier, control subcarrier, first control signal and second control signal for the purpose of receiving the television sound multiplex broadcasting.

* * * * *

UNITED STATES PATENT AND TRADEMARK OFFICE
CERTIFICATE OF CORRECTION

PATENT NO. : 4,272,788
DATED : June 9, 1981
INVENTOR(S) : Minoru OGITA

It is certified that error appears in the above—identified patent and that said Letters Patent is hereby corrected as shown below:

COLUMN 16, line 18 (claim 5), after "discriminator means" change "to and" to --and to--.

Signed and Sealed this

Twenty-second Day of September 1981

[SEAL]

Attest:

GERALD J. MOSSINGHOFF

*Attesting Officer*  *Commissioner of Patents and Trademarks*